United States Patent
Obata

(10) Patent No.: US 11,710,766 B2
(45) Date of Patent: Jul. 25, 2023

(54) SEMICONDUCTOR DEVICE CONTAINING AN OXYGEN CONCENTRATION DISTRIBUTION

(71) Applicant: FUJI ELECTRIC CO., LTD., Kanagawa (JP)

(72) Inventor: Tomoyuki Obata, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 17/209,242

(22) Filed: Mar. 23, 2021

(65) Prior Publication Data
US 2021/0210595 A1  Jul. 8, 2021

Related U.S. Application Data

(63) Continuation of application No. PCT/JP2020/006920, filed on Feb. 20, 2020.

(30) Foreign Application Priority Data

Apr. 26, 2019 (JP) .................................. 2019-086038

(51) Int. Cl.
*H01L 29/06* (2006.01)
*H01L 27/07* (2006.01)
(Continued)

(52) U.S. Cl.
CPC .......... *H01L 29/0603* (2013.01); *H01L 23/14* (2013.01); *H01L 27/0727* (2013.01); *H01L 29/32* (2013.01)

(58) Field of Classification Search
CPC ..... H01L 29/0603; H01L 29/32; H01L 23/14; H01L 29/407; H01L 29/4238;
(Continued)

(56) References Cited

U.S. PATENT DOCUMENTS

2008/0315364 A1  12/2008  Nemoto
2016/0104622 A1  4/2016  Oefner
(Continued)

FOREIGN PATENT DOCUMENTS

JP    2007266103 A    10/2007
JP    2008177296 A    7/2008
(Continued)

OTHER PUBLICATIONS

English machine translation of JP-2011222550-A (Year: 2011).*
(Continued)

*Primary Examiner* — Laura M Menz
*Assistant Examiner* — Candice Chan

(57) ABSTRACT

Provided is a semiconductor device comprising a semiconductor substrate containing oxygen. An oxygen concentration distribution in a depth direction of the semiconductor substrate has a high oxygen concentration part where an oxygen concentration is higher on a further upper surface-side than a center in the depth direction of the semiconductor substrate than in a lower surface of the semiconductor substrate. The high oxygen concentration part may have a concentration peak in the oxygen concentration distribution. A crystal defect density distribution in the depth direction of the semiconductor substrate has an upper surface-side density peak on the upper surface-side of the semiconductor substrate, and the upper surface-side density peak may be arranged within a depth range in which the oxygen concentration is equal to or greater than 50% of a peak value of the concentration peak.

14 Claims, 12 Drawing Sheets

(51) Int. Cl.
  *H01L 29/32* (2006.01)
  *H01L 23/14* (2006.01)
(58) Field of Classification Search
  CPC ............. H01L 29/0696; H01L 29/0834; H01L 29/66348; H01L 29/7397; H01L 29/8613; H01L 27/0727; H01L 21/3221; H01L 21/324
  See application file for complete search history.

(56) References Cited

U.S. PATENT DOCUMENTS

| | | |
|---|---|---|
| 2017/0271447 A1 | 9/2017 | Tamura |
| 2018/0166279 A1 | 6/2018 | Tamura |
| 2020/0035817 A1 | 1/2020 | Tamura |

FOREIGN PATENT DOCUMENTS

| | | |
|---|---|---|
| JP | 2010165772 A | 7/2010 |
| JP | 2011222550 A | 11/2011 |
| JP | 2012238904 A | 12/2012 |
| JP | 2015198166 A | 11/2015 |
| JP | 2016111337 A | 6/2016 |
| JP | 2016184713 A | 10/2016 |
| JP | 2018137454 A | 8/2018 |
| WO | 2016157935 A1 | 10/2016 |
| WO | 2019078131 A1 | 4/2019 |

OTHER PUBLICATIONS

Extended European Search Report for European Patent Application No. 20794991.8, issued by the European Patent Office dated Oct. 18, 2021.
Office Action issued for counterpart Japanese Application No. 2021-515833, issued by the Japan Patent Office dated May 10, 2022 (drafted on Apr. 28, 2022).
International Search Report and (ISA/237) Written Opinion of the International Search Authority for International Patent Application No. PCT/JP2020/006920, mailed by the Japan Patent Office dated May 26, 2020.
Office Action issued for counterpart Japanese Application No. 2021-515833, issued by the Japanese Patent Office dated Oct. 11, 2022 (drafted on Oct. 4, 2022).

* cited by examiner

SEMICONDUCTOR DEVICE CONTAINING AN OXYGEN CONCENTRATION DISTRIBUTION

The contents of the following Japanese patent applications are incorporated herein by reference:
NO. 2019-086038 filed in JP on Apr. 26, 2019, and
PCT/JP2020/006920 filed in WO on Feb. 20, 2020

BACKGROUND

1. Technical Field

The present invention relates to a semiconductor device and a manufacturing method.

2. Related Art

In the related art, known is a semiconductor device in which a semiconductor substrate is formed with semiconductor elements such as a transistor, a diode and the like (for example, refer to Patent Documents 1 to 4).

CITATION LIST

Patent Document

Patent Document 1: Japanese Patent Application Publication No. 2010-165772
Patent Document 2: Japanese Patent Application Publication No. 2012-238904
Patent Document 3: Japanese Patent Application Publication No. 2018-137454
Patent Document 4: Japanese Patent Application Publication No. 2015-198166

Technical Problem

Characteristics of the semiconductor device may vary depending on a concentration of oxygen included in the semiconductor substrate.

GENERAL DISCLOSURE

In order to solve the above problem, a first aspect of the present invention provides a semiconductor device comprising a semiconductor substrate containing oxygen. An oxygen concentration distribution in a depth direction of the semiconductor substrate may have a high oxygen concentration part where an oxygen concentration is higher on a further upper surface-side than a center in the depth direction of the semiconductor substrate than in a lower surface of the semiconductor substrate.

The high oxygen concentration part may have a concentration peak in the oxygen concentration distribution.

The oxygen concentration may decrease from the concentration peak toward the lower surface of the semiconductor substrate until it becomes the same as the oxygen concentration in the lower surface of the semiconductor substrate.

A crystal defect density distribution in the depth direction of the semiconductor substrate may have an upper surface-side density peak on the upper surface-side of the semiconductor substrate. The upper surface-side density peak may be arranged within a depth range in which the oxygen concentration is equal to or greater than 50% of a peak value of the concentration peak. The upper surface-side density peak may also be arranged within a depth range in which the oxygen concentration is equal to or greater than 80% of the peak value of the concentration peak.

In the oxygen concentration distribution, the depth range in which the oxygen concentration is equal to or greater than 50% of the peak value of the concentration peak may be equal to or greater than 10 µm.

The concentration peak may be arranged between the upper surface-side density peak and the upper surface of the semiconductor substrate.

The peak value of the concentration peak may be 1.5 times or greater as large as a minimum value of the oxygen concentration in the oxygen concentration distribution. The peak value of the concentration peak may be 5 times or greater as large as the minimum value of the oxygen concentration in the oxygen concentration distribution.

A distance between the concentration peak of the oxygen concentration distribution and the upper surface of the semiconductor substrate may be equal to or greater than 5 µm and equal to or smaller than 20 µm.

The semiconductor device may comprise a gate conductive portion provided in the upper surface of the semiconductor substrate and a gate insulating film for insulating the gate conductive portion and the semiconductor substrate from each other.

The semiconductor device may comprise a cathode region of a first conductivity-type provided in contact with the lower surface of the semiconductor substrate, and an anode region of a second conductivity-type provided in contact with the upper surface of the semiconductor substrate.

A second aspect of the present invention provides a manufacturing method of a semiconductor device comprising a semiconductor substrate containing oxygen. The manufacturing method may comprise an annealing step of annealing an initial substrate so that a solid solubility limit concentration of oxygen with respect to the initial substrate is to be higher than a current oxygen concentration in the initial substrate. The manufacturing method may comprise a thinning step of thinning the initial substrate from a lower surface-side of the initial substrate to form a semiconductor substrate.

The manufacturing method may comprise a preparation step of preparing an MCZ substrate as the initial substrate. The manufacturing method may comprise a preparation step of preparing an FZ substrate as the initial substrate.

The summary clause does not necessarily describe all necessary features of the embodiments of the present invention. The present invention may also be a sub-combination of the features described above.

DESCRIPTION OF EXEMPLARY EMBODIMENTS

Figure 1:
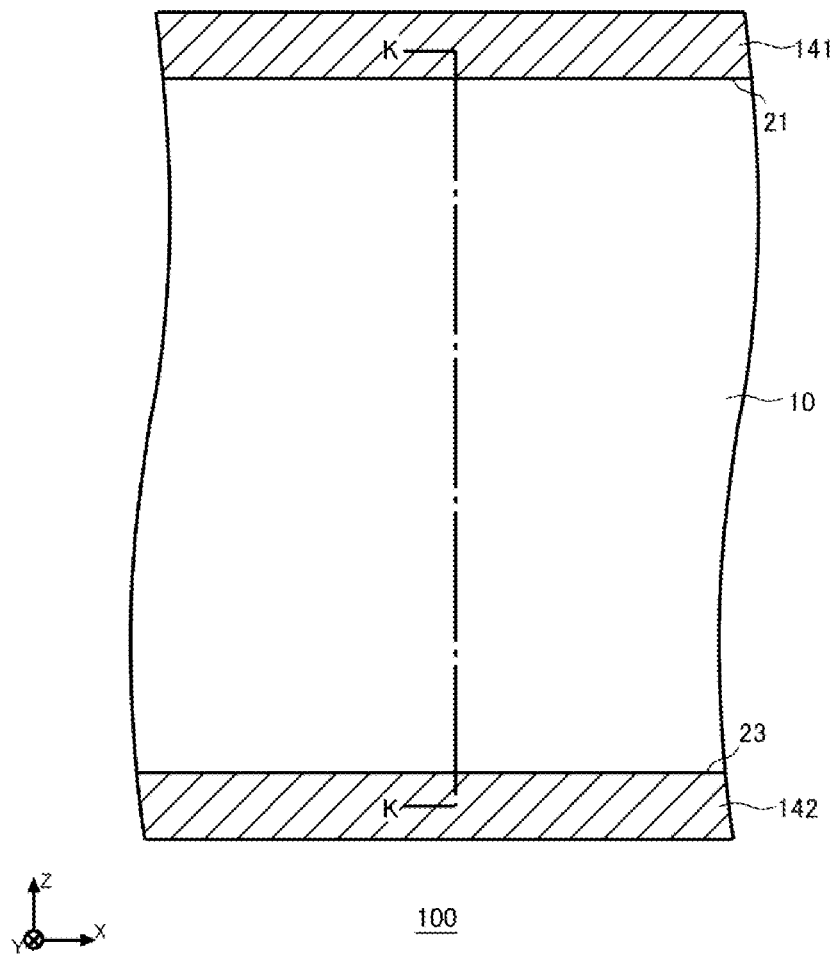
FIG. 1 is a cross-sectional view pictorially showing a semiconductor device 100 in accordance with one embodiment of the present invention.

Hereinafter, the present invention will be described through embodiments of the invention. However, the following embodiments do not limit the invention defined in the claims. Also, all combinations of features described in the embodiments are not necessarily essential to solutions of the invention.

As used herein, one side in a direction parallel to a depth direction of a semiconductor substrate is referred to as 'upper' and the other side is referred to as 'lower'. One surface of two principal surfaces of a substrate, a layer or other member is referred to as 'upper surface', and the other surface is referred to as 'lower surface'. The 'upper' and 'lower' directions are not limited to a gravity direction or a direction when mounting a semiconductor device.

As used herein, the technical matters may be described using orthogonal coordinate axes of X-axis, Y-axis and Z-axis, in some cases. The orthogonal coordinate axes simply specify a relative position of a constitutional element, not limiting a specific direction. For example, the Z-axis does not limit a height direction with respect to the ground. Note that, the +Z-axis direction and the −Z-axis direction are opposite to each other. When the Z-axis direction is simply described without denoting +/−, it means a direction parallel to the +Z-axis and the −Z-axis. As used herein, when seen from the +Z-axis direction, it may also be referred to "as seen from above".

As used herein, the description "same" or "equal" may include a case where there is an error due to manufacturing variation and the like. The error is, for example, within 10%.

As used herein, a conductivity type of a doped region in which impurities are doped is described as P type or N type. The conductivity types of each of the doped regions may also be opposite polarities. Also, as used herein, P+ type or N+ type means that a doping concentration is higher than P type or N type, and P− type or N− type means that a doping concentration is lower than P type or N type. Also, as used herein, P++ type or N++ type means that a doping concentration is higher than P+ type or N+ type.

As used herein, a doping concentration refers to a concentration of impurities activated as donors or acceptors. As used herein, a concentration difference of donors and acceptors may also be defined as the doping concentration. The concentration difference may be measured by a voltage-capacitance measurement method (CV method). A carrier concentration that is measured by a spreading resistance (SR) measurement method may also be defined as the doping concentration. Also, in a case where a doping concentration distribution has a peak, the peak value may be defined as the doping concentration in the region. In a case where the doping concentration in a region in which donors or acceptors are present is substantially uniform, for example, an average value of the doping concentration may also be defined as the doping concentration in the region. As used herein, a concentration of dopants indicates a concentration of each of donors and acceptors.

FIG. 1 is a cross-sectional view pictorially showing a semiconductor device 100 in accordance with one embodiment of the present invention. The semiconductor device 100 comprises a semiconductor substrate 10. The semiconductor substrate 10 is a substrate formed of a semiconductor material such as silicon, compound semiconductor or the like. In the present example, the semiconductor substrate 10 is a silicon substrate.

The semiconductor substrate 10 has an upper surface 21 and a lower surface 23. The upper surface 21 and the lower surface 23 are two principal surfaces facing each other. In FIG. 1, a direction connecting the upper surface 21 and the lower surface 23 (i.e., a depth direction of the semiconductor substrate 10) is defined as a Z-axis direction. Also, two orthogonal axes parallel to the upper surface 21 and the lower surface 23 are defined as an X-axis and a Y-axis. The semiconductor substrate 10 is formed with semiconductor elements such as a transistor, a diode and the like, which are omitted in FIG. 1.

The semiconductor device 100 may comprise an upper surface-side electrode 141 and a lower surface-side electrode 142. The upper surface-side electrode 141 is a metal electrode arranged above the upper surface 21. The lower surface-side electrode 142 is a metal electrode arranged below the lower surface 23. The upper surface-side electrode 141 and the lower surface-side electrode 142 may be provided in contact with the semiconductor substrate 10, or an interlayer dielectric film may be provided between the upper surface-side electrode 141 and the semiconductor substrate 10, and between the lower surface-side electrode 142 and the semiconductor substrate 10. In FIG. 1, the interlayer dielectric film is omitted.

The semiconductor substrate 10 contains oxygen. Oxygen may be contained in the entire semiconductor substrate 10. Characteristics of the semiconductor device 100 vary depending on a concentration of oxygen contained in the semiconductor substrate 10.

For example, the semiconductor substrate 10 may be formed with a defect level for adjusting a lifetime of carrier. The defect level may be formed by irradiating the semiconductor substrate 10 with particles such as helium ions or hydrogen ions (for example, protons), electron beams or the like. When particles such as helium ions are irradiated, vacancy (V) is generated in the semiconductor substrate 10, and vacancy and oxygen combine to generate a VO defect. The carrier recombines with the VO defect and the like, so that the lifetime of carrier is reduced. A density of the VO defects depends on an oxygen concentration in the semiconductor substrate 10. Therefore, even though helium ions or the like are irradiated in similar conditions, when variation in oxygen concentration occurs in the semiconductor substrate 10, the characteristics such as the lifetime of carrier vary.

The semiconductor substrate 10 is a chip individualized from a wafer cut from an ingot that is formed by a method such as an MCZ (Magneticfield applied Czochralski) method, an FZ (Floating Zone) method and the like. In the semiconductor substrate 10, oxygen introduced intentionally or unintentionally during a manufacturing process is contained. However, the oxygen concentration in the semiconductor substrate 10 varies due to variations in manufacturing conditions and the like.

In the present example, for a substrate in a wafer or chip state, annealing is performed at a predetermined annealing temperature for a predetermined annealing time. During the annealing, a surface of the substrate is exposed to an oxygen containing atmosphere or is formed with an oxide film. The annealing time is such a long time that oxygen having a concentration of a solid solubility limit corresponding to the annealing temperature is introduced into the substrate. The annealing time may be 1 hour or longer, 2 hours or longer or 10 hours or longer. The solid solubility limit of oxygen indicates a limit concentration of oxygen that can be dissolved in the substrate, and changes depending on the annealing temperature.

The substrate is annealed for a predetermined annealing time or longer, so that oxygen having a concentration, which substantially coincides with the solid solubility limit, is introduced in the vicinity of at least a surface of the substrate. For this reason, it is possible to control the oxygen concentration in the semiconductor substrate 10 by managing the annealing temperature so as to be the solid solubility limit corresponding to a desired oxygen concentration. In addition, since the annealing temperature can be managed relatively easily, it is also possible to reduce variation in oxygen concentration among substrates.

Figure 2:
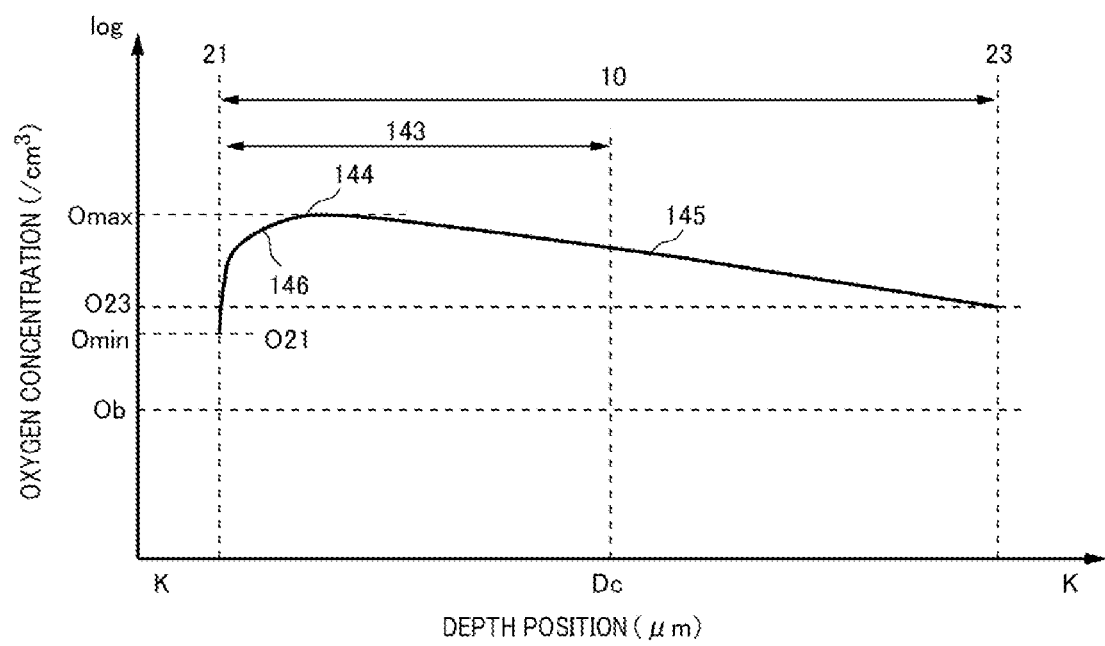
FIG. 2 shows an example of an oxygen concentration distribution in a depth direction of a semiconductor substrate 10.

FIG. 2 shows an example of an oxygen concentration distribution in the depth direction of the semiconductor substrate 10. In FIG. 2, a vertical axis is a logarithmic axis indicating the oxygen concentration per a unit volume, and a horizontal axis is a linear axis indicating a depth position in the semiconductor substrate 10. FIG. 2 shows an oxygen concentration distribution in a K-K cross-section in FIG. 1. In FIG. 2, the oxygen concentration in the semiconductor substrate 10 before the annealing process is denoted as an initial concentration Ob. The initial concentration Ob corresponds to an oxygen concentration in a substrate in a wafer state.

The annealing process introduces oxygen into the semiconductor substrate 10 from the upper surface 21. Note that, the annealing temperature is a temperature at which the solid solubility limit becomes greater than the initial concentration Ob. Since oxygen diffuses from the upper surface 21 toward an inside of the semiconductor substrate 10, the oxygen concentration becomes smaller away from the upper surface 21.

Oxygen is also similarly introduced from the lower surface 23 of the semiconductor substrate 10. In the semiconductor substrate 10 of the present example, however, a thickness of the semiconductor substrate 10 is adjusted by grinding the semiconductor substrate 10 from the lower surface 23-side after the annealing process. In the present example, the grinding is performed over a range wider than a depth range within which oxygen is introduced from the lower surface 23-side. For this reason, in the oxygen concentration distribution shown in FIG. 2, the oxygen concentration becomes smaller toward the lower surface 23.

The oxygen concentration distribution in the semiconductor substrate 10 has a high oxygen concentration part 143 where the oxygen concentration is higher on the further upper surface 21-side than a center Dc in the depth direction of the semiconductor substrate 10 than in the lower surface 23 of the semiconductor substrate 10. In the example of FIG. 2, the oxygen concentration in the lower surface 23 of the semiconductor substrate 10 is denoted as O23. As described above, the annealing process is performed at the annealing temperature at which the solid solubility limit becomes greater than the initial concentration Ob. Thereby, oxygen having a concentration corresponding to the solid solubility limit is introduced within a predetermined distance from the upper surface 21 of the semiconductor substrate 10, and the oxygen concentration is reduced away from the upper surface 21. For this reason, the high oxygen concentration part 143 where the oxygen concentration is higher than the lower surface 23 is formed on the upper surface 21-side of the semiconductor substrate 10. By the above configuration, it is possible to accurately control the oxygen concentration in the semiconductor substrate 10 by the annealing temperature.

The high oxygen concentration part 143 may have a concentration peak 144 in the oxygen concentration distribution. The concentration peak 144 is a point at which the oxygen concentration becomes largest in the oxygen concentration distribution. In the present example, an oxygen concentration at the concentration peak 144 is denoted as Omax. The oxygen concentration Omax may coincide with the solid solubility limit that is determined by the annealing temperature.

While the temperature of the semiconductor substrate 10 returns to room temperatures as the annealing process is over, oxygen in the vicinity of the upper surface 21 of the semiconductor substrate 10 may be released to an outside of the semiconductor substrate 10. Thereby, in the semiconductor substrate 10 of the present example, the concentration peak 144 occurs in the oxygen concentration distribution. The oxygen concentration distribution has an upper surface-side slope 146 between the concentration peak 144 and the upper surface 21 and a lower surface-side slope 145 between the concentration peak 144 and the lower surface 23. Each slope is a region in which the oxygen concentration becomes smaller away from the concentration peak 144.

The oxygen concentration distribution in the depth direction of the semiconductor substrate 10 may decrease from the concentration peak 144 toward the lower surface 23 of the semiconductor substrate 10 until it becomes the same as the oxygen concentration O23 in the lower surface 23 of the semiconductor substrate 10. The oxygen concentration in the lower surface-side slope 145 of the present example continuously decreases from the concentration peak 144 to the lower surface 23. A gradient of the lower surface-side slope 145 may be gentler than a gradient of the upper surface-side slope 146. Thereby, it is possible to make a moderate change in oxygen concentration over a wide region of the semiconductor substrate 10.

An oxygen concentration in the upper surface 21 of the semiconductor substrate 10 is denoted as O21. In the present example, the oxygen concentration in the upper surface-side slope 146 continuously decreases from the oxygen concentration Omax at the concentration peak 144 to the oxygen concentration O21 in the upper surface 21. The oxygen concentration O21 may be higher than the initial concentration Ob. The oxygen concentration O21 may also be lower or higher than the oxygen concentration O23. The oxygen concentration O21 may also coincide with a minimum value Omin of the oxygen concentration in the semiconductor substrate 10.

A distance between the concentration peak 144 and the upper surface 21 in the depth direction may be equal to or greater than 5 µm and equal to or smaller than 20 µm. A depth position of the concentration peak 144 can be controlled by the annealing temperature and the annealing time. The depth position of the concentration peak 144 may be ¼ or less, ⅕ or less or ⅒ or less of the thickness of the semiconductor substrate 10 in the depth direction. The concentration peak 144 may be provided over a predetermined depth range. That is, the oxygen concentration distribution may be provided with a region of the oxygen concentration Omax over a predetermined depth range.

Figure 3:
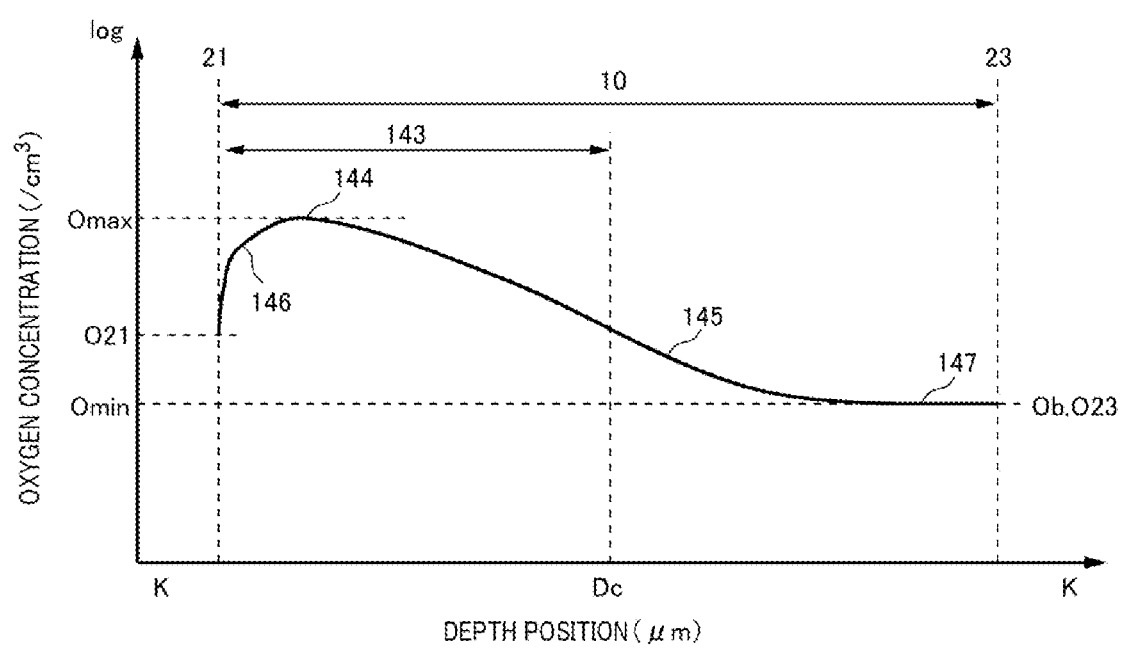
FIG. 3 shows another example of the oxygen concentration distribution in the depth direction of the semiconductor substrate 10.

FIG. 3 shows another example of the oxygen concentration distribution in the depth direction of the semiconductor substrate 10. Also in the oxygen concentration distribution of the present example, the oxygen concentration decreases from the concentration peak 144 toward the lower surface 23 of the semiconductor substrate 10 until it becomes the same as the oxygen concentration O23 in the lower surface 23 of the semiconductor substrate 10. However, the oxygen concentration distribution has a flat region 147 in which the oxygen concentration coincides with the oxygen concentration O23 over a predetermined depth range from the lower surface 23. The flat region 147 may be arranged in a region on the lower surface 23-side of the semiconductor substrate 10 (i.e., a region from the center position Dc to the lower surface 23) or may be arranged extending up to a region on the upper surface 21-side (i.e., a region from the center position Dc to the upper surface 21).

Depending on the annealing conditions, there is a region inside the substrate in which oxygen from the upper surface 21 does not diffuse. The oxygen concentration in the region is substantially equal to the initial concentration Ob. By grinding the lower surface 23-side so as to leave the region, it is possible to form the semiconductor substrate 10 having the oxygen concentration distribution as shown in FIG. 3.

In the examples of FIGS. 2 and 3, the lower surface-side slope 145 may be provided from a region on the upper surface 21-side to a region on the lower surface 23-side. A length of the lower surface-side slope 145 in the depth direction may be ⅕ or greater, ¼ or greater, ⅓ or greater or ½ or greater than the thickness of the semiconductor substrate 10 in the depth direction. The length of the lower surface-side slope 145 in the depth direction may also be 20 µm or longer, 30 µm or longer, 40 µm or longer or 50 µm or longer. The length of the lower surface-side slope 145 in the depth direction may also be 2 times or greater, 4 times or greater or 10 times or greater as large as a length of the upper surface-side slope 146 in the depth direction.

Figure 4:
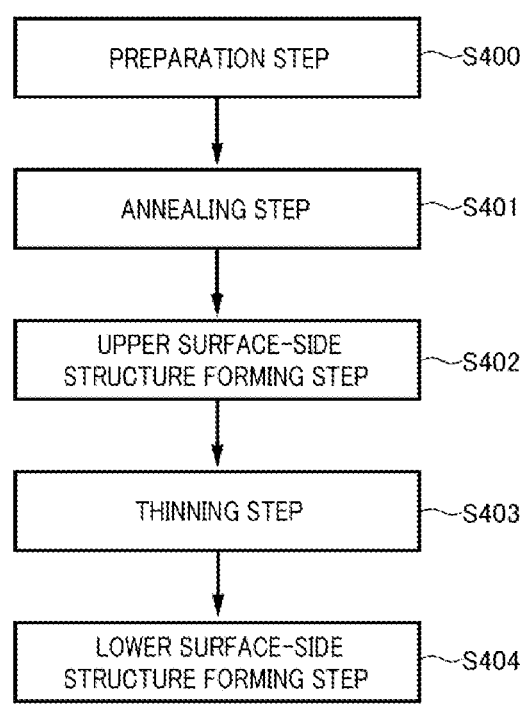
FIG. 4 shows some processes of a manufacturing method of the semiconductor device 100.

FIG. 4 shows some processes of a manufacturing method of the semiconductor device 100. In the manufacturing method of the present example, an initial substrate is prepared in a preparation step S400. The initial substrate may be an MCZ substrate formed by the MCZ method, an FZ substrate formed by the FZ method, or a substrate formed by another method. As described above, the initial substrate is in a wafer or chip state. An oxygen concentration in the initial substrate is the initial concentration Ob.

Then, the initial substrate is annealed in an annealing step S401. In the annealing step S401, the initial substrate is annealed under oxygen containing atmosphere or is annealed in a state where a natural oxide film is formed on a surface thereof. In the annealing step S401, the initial substrate is annealed at a predetermined annealing temperature for a predetermined annealing time so that a solid solubility limit concentration of oxygen with respect to the initial substrate is to be higher than a current oxygen concentration in the initial substrate. The current oxygen concentration refers to the initial concentration Ob before the annealing process. After the annealing, the oxygen concentration distribution on the upper surface-side of the initial substrate is similar to the distribution shown in FIG. 2 or FIG. 3. The oxygen concentration distribution on the lower surface-side of the initial substrate is also similar to a distribution where the horizontal axis of FIG. 2 or FIG. 3 is replaced with a depth position based on the lower surface.

The solid solubility limit of oxygen with respect to the silicon substrate is about $2\times10^{17}/cm^3$ when the annealing temperature is 1000° C., and about $5\times10^{17}/cm^3$ when the annealing temperature is 1150° C. In the annealing step S401, the annealing temperature at which the solid solubility limit becomes greater than an initial oxygen concentration is set, according to the initial oxygen concentration in the initial substrate and a material of the initial substrate.

Subsequently, in an upper surface-side structure forming step S402, an upper surface-side structure of the semiconductor device 100 is formed. The upper surface-side structure includes an electrode and an insulating film arranged above the upper surface 21 of the semiconductor substrate 10, a doped region formed inside the semiconductor substrate 10, and the like. The doped region refers to a region in which dopants are implanted. For example, in a case where the semiconductor device 100 is a transistor, a structure on the upper surface 21-side includes an emitter electrode, an interlayer dielectric film, a gate conductive portion, a gate insulating film, an emitter region of N type, a base region of P type, and the like. Note that, the annealing step S401 may also be performed during the upper surface-side structure forming step S402. The annealing step S401 may also be performed before forming an emitter electrode on the upper surface of the initial substrate. The annealing step S401 may also be a step common to or different from another annealing step for activating dopants, for example.

Subsequently, in a thinning step S403, the initial substrate is thinned from the lower surface-side of the initial substrate to form the semiconductor substrate 10. In the thinning step S403, the initial substrate may be thinned by CMP or the like. Thereby, the oxygen concentration distribution in the semiconductor substrate 10 becomes the distribution as shown in FIG. 2 or FIG. 3.

Subsequently, in a lower surface-side structure forming step S404, a lower surface-side structure of the semiconductor device 100 is formed. The lower surface-side structure includes an electrode arranged below the lower surface 23 of the semiconductor substrate 10, a doped region formed inside the semiconductor substrate 10, and the like. For example, in a case where the semiconductor device 100 is a transistor, a structure on the lower surface 23-side includes a collector region of P type, and the like.

By the above processes, it is possible to manufacture the semiconductor device 100 having the oxygen concentration distribution as shown in FIG. 2 or FIG. 3. Note that, the oxygen concentration on the upper surface 21-side of the semiconductor substrate 10 can be controlled relatively accurately by the annealing temperature. On the other hand, since the initial concentration Ob highly affects the oxygen concentration on the lower surface 23-side of the semiconductor substrate 10, variation in oxygen concentration is more likely to increase than the upper surface 21-side. By forming a structure including a channel of a transistor and the like on the upper surface 21-side of the semiconductor substrate 10, it is possible to further reduce variation in characteristics of the semiconductor device 100.

The conditions in the annealing step S401 may be set so that a concentration peak value Omax at the concentration peak 144 in the oxygen concentration distribution in the depth direction of the semiconductor substrate 10 is 1.5 times or greater as large as the minimum value Omin of the oxygen concentration. The concentration peak value Omax is substantially equal to the solid solubility limit corresponding to the annealing temperature. The minimum value Omin of the oxygen concentration is equal to or larger than the initial concentration Ob. For this reason, by setting the concentration peak value Omax to 1.5 times or greater of the minimum value Omin, it is possible to anneal the initial substrate at the solid solubility limit sufficiently higher than the initial concentration Ob. Thereby, it is possible to reduce the variation in oxygen concentration in the semiconductor substrate 10. Note that, when manufacturing a plurality of semiconductor devices 100, the annealing condition at which the solid solubility limit is 1.5 times as large as the maximum initial concentration Ob value of the initial concentrations Ob of the plurality of initial substrates may be set. Each of the initial substrates is subjected to the annealing process at the set common annealing condition. Thereby, it is possible to reduce variation in oxygen concentration in each substrate by suppressing an influence of variation in the initial concentration Ob.

The concentration peak value Omax may be 5 times or greater or 10 times or greater as large as the minimum value Omin. Thereby, it is possible to further reduce the variation in oxygen concentration in the semiconductor substrate 10.

Figure 5:
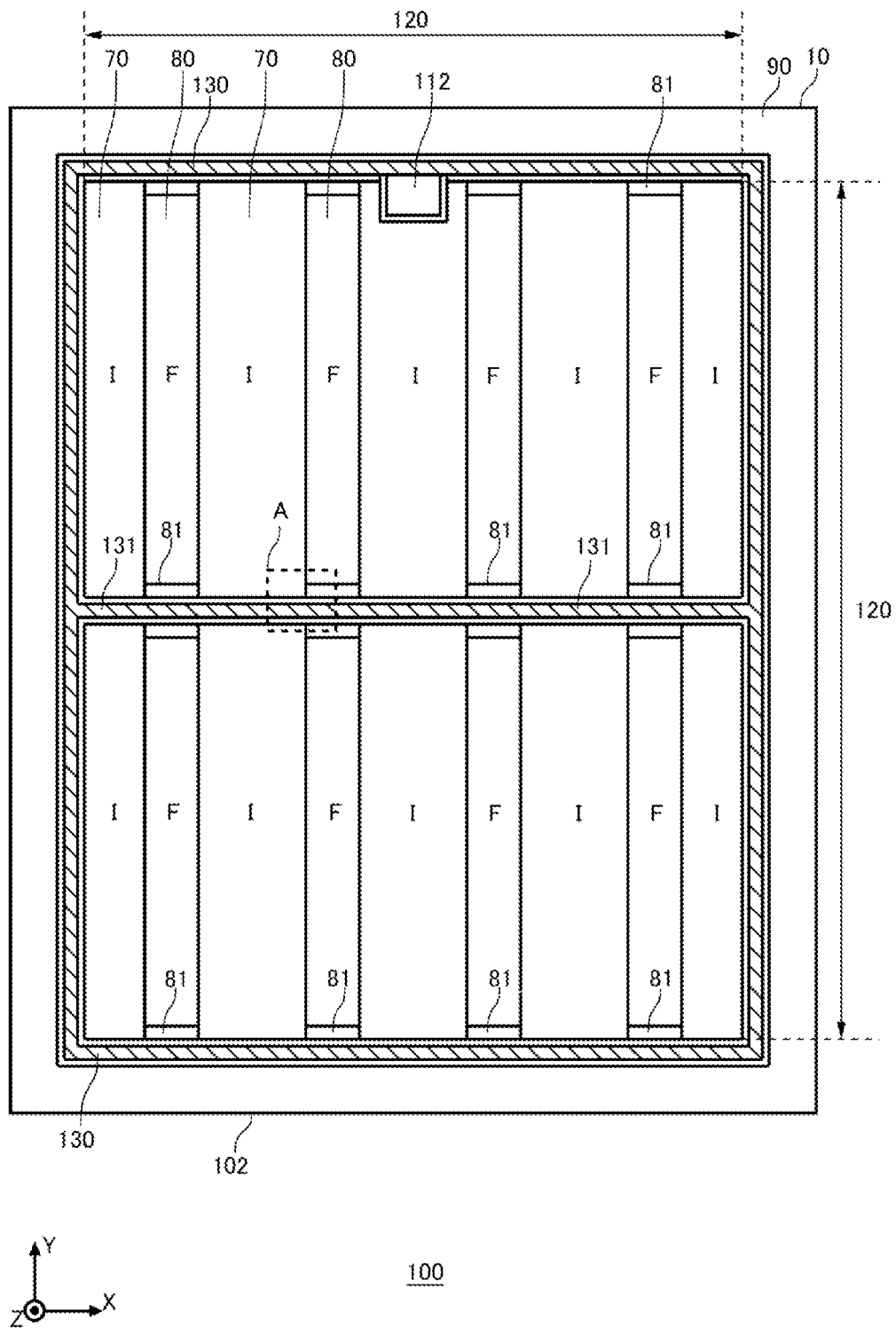
FIG. 5 is a top view showing an example of the semiconductor device 100 in accordance with one embodiment of the present invention.

FIG. 5 is a top view showing an example of the semiconductor device 100 in accordance with one embodiment of the present invention. In FIG. 5, positions at which each of members is projected to the upper surface of the semiconductor substrate 10 are shown. In FIG. 5, only some members of the semiconductor device 100 are shown, and some members are omitted.

The semiconductor substrate 10 has end sides 102, as seen from above. As used herein, "as seen from above" means seeing from the upper surface-side of the semiconductor substrate 10. The semiconductor substrate 10 of the present example has two sets of ends 102 facing each other, as seen from above. In FIG. 5, the X-axis and the Y-axis are parallel to any one end side 102. The Z-axis is perpendicular to the upper surface of the semiconductor substrate 10.

The semiconductor substrate 10 is provided with an active portion 120. The active portion 120 is a region in which main current flows in the depth direction between the upper surface and the lower surface of the semiconductor substrate 10 when the semiconductor device 100 is controlled to an on-state. An emitter electrode is provided above the active portion 120 but is omitted in FIG. 5.

The active portion 120 is provided with transistor portions 70 each including a transistor element such as an IGBT, and diode portions 80 each including a diode element such as an FWD. In FIG. 5, a region in which the transistor portion 70 is arranged is denoted with a reference sign "I", and a region in which the diode portion 80 is arranged is denoted with a reference sign "F". The transistor portions 70 and the diode portions 80 are arranged side by side along a predetermined arrangement direction (X-axis direction, in FIG. 5). The transistor portions 70 and the diode portions 80 may also be alternately arranged side by side in the X-axis direction. As used herein, a direction perpendicular to the arrangement direction, as seen from above, may also be referred to as an extension direction (Y-axis direction, in FIG. 5). The transistor portions 70 and the diode portions 80 may each have a long side in the extension direction. That is, a length of the transistor portion 70 in the Y-axis direction is greater than a width in the X-axis direction. Similarly, a length of the diode portion 80 in the Y-axis direction is greater than a width in the X-axis direction. The longitudinal directions of the transistor portion 70 and the diode portion 80 may be the same as or different from a longitudinal direction of a trench portion, which will be described later.

The diode portion 80 has a cathode region of N+ type in a region in contact with the lower surface of the semiconductor substrate 10. As used herein, the region in which the cathode region is provided is referred to as the diode portion 80. That is, the diode portion 80 is a region overlapping the cathode region, as seen from above. The lower surface of the semiconductor substrate 10 may also be provided with a collector region of P+ type, in a region other than the cathode region. As used herein, an extension region 81 in which the diode portion 80 is extended to a gate wire (which will be described later) in the Y-axis direction may also be included in the diode portion 80. A lower surface of the extension region 81 is provided with a collector region.

The semiconductor device 100 may have one or more pads above the semiconductor substrate 10. The semiconductor device 100 of the present example has a gate pad 112. The semiconductor device 100 may have an anode pad, a cathode pad and a current detection pad, in addition to the gate pad 112. Each pad is arranged in the vicinity of the end side 102. The vicinity of the end side 102 indicates a region between the end side 102 and the emitter electrode, as seen from above. When mounting the semiconductor device 100, each pad may be connected to an external circuit via a wire, for example.

The gate pad 112 is applied with a gate potential. The gate pad 112 is electrically connected to a conductive portion of a gate trench portion of the active portion 120. The semiconductor device 100 has a gate wire for connecting the gate pad 112 and the gate trench portion each other. In FIG. 5, the gate wire is obliquely hatched.

The gate wire of the present example has an outer periphery gate wire 130, and an active-side gate wire 131. The outer periphery gate wire 130 is arranged between the active portion 120 and the end sides 102 of the semiconductor substrate 10, as seen from above. The outer periphery gate wire 130 of the present example surrounds the active portion 120, as seen from above. As seen from above, a region surrounded by the outer periphery gate wire 130 may also be set as the active portion 120. The outer periphery gate wire 130 is also connected to the gate pad 112. The outer periphery gate wire 130 is arranged above the semiconductor substrate 10. The outer periphery gate wire 130 may be a metal wire including aluminum and the like.

The active-side gate wire 131 is provided in the active portion 120. The active portion 120 is provided with the active-side gate wire 131, so that it is possible to reduce variation in wire length from the gate pad 112, for each region of the semiconductor substrate 10.

The active-side gate wire 131 is connected to a gate trench portion of the active portion 120. The active-side gate wire 131 is arranged above the semiconductor substrate 10. The active-side gate wire 131 may also be a wire formed of semiconductor such as polysilicon having impurities doped therein.

The active-side gate wire 131 may also be connected to the outer periphery gate wire 130. The active-side gate wire 131 of the present example is provided extending in the X-axis direction so as to traverse the active portion 120 from the outer periphery gate wire 130 on one side to the outer periphery gate wire 130 on the other side at a substantial center in the Y-axis direction.

The semiconductor device 100 may also comprise a temperature sensing unit (not shown) that is a PN-junction diode formed of polysilicon or the like, and a current detection unit (not shown) for simulating an operation of a transistor portion provided in the active portion 120.

The semiconductor device 100 of the present example comprises an edge termination structure portion 90 between the outer periphery gate wire 130 and the end side 102. The edge termination structure portion 90 relaxes electric field concentration on the upper surface-side of the semiconductor substrate 10. The edge termination structure portion 90 has, for example, a guard ring provided in an annular shape with surrounding the active portion 120, a field plate, RESURF and a combined structure thereof.

Figure 6:
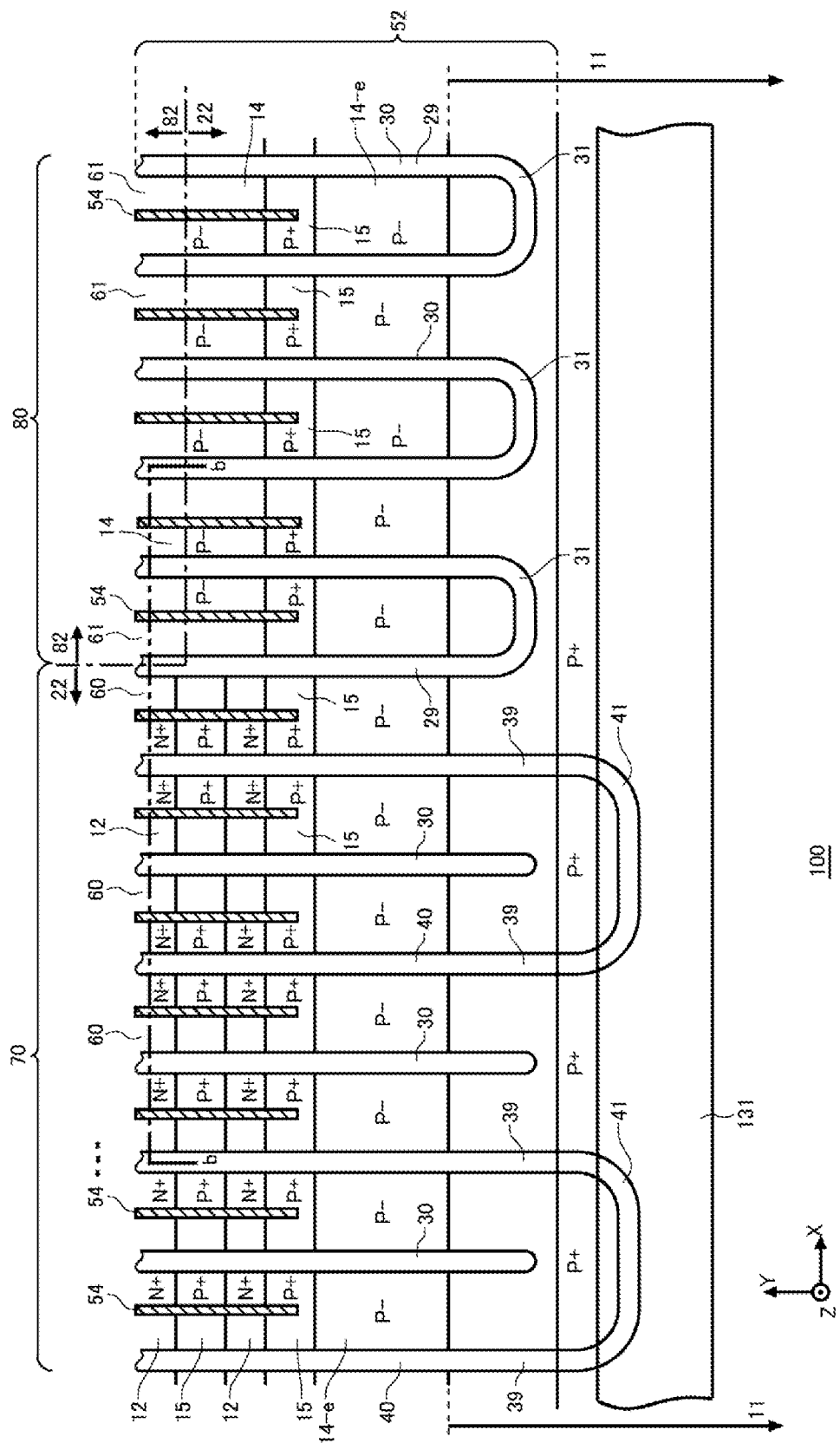
FIG. 6 is an enlarged view of a region A shown in FIG. 5.

FIG. 6 is an enlarged view of a region A shown in FIG. 5. The region A is a region including the transistor portion 70, the diode portion 80 and the active-side gate wire 131. In a region where the active portion 120 and the outer periphery gate wire 130 are adjacent to each other, the outer periphery gate wire 130 may be arranged instead of the active-side gate wire 131.

The semiconductor device 100 of the present example comprises gate trench portions 40, dummy trench portions 30, a well region 11, emitter regions 12, base regions 14 and contact regions 15, which are provided inside the upper surface-side of the semiconductor substrate 10. The gate trench portion 40 and the dummy trench portion 30 are each an example of the trench portion. The semiconductor device 100 of the present example also comprises an emitter electrode 52 and an active-side gate wire 131 provided above the upper surface of the semiconductor substrate 10. The emitter electrode 52 and the active-side gate wire 131 are provided separated from each other.

An interlayer dielectric film is provided between the emitter electrode 52 and active-side gate wire 131 and the upper surface of the semiconductor substrate 10 but is not shown in FIG. 6. In the interlayer dielectric film of the present example, contact holes 54 are provided penetrating through the interlayer dielectric film. In FIG. 6, the contact holes 54 are each obliquely hatched.

The emitter electrode 52 is provided above the gate trench portions 40, the dummy trench portions 30, the well region 11, the emitter regions 12, the base regions 14 and the contact regions 15. The emitter electrode 52 is in contact with the emitter regions 12, the contact regions 15 and the base regions 14 in the upper surface of the semiconductor substrate 10 via the contact holes 54. The emitter electrode 52 is also connected to a dummy conductive portion in the dummy trench portion 30 via the contact holes provided in the interlayer dielectric film. The emitter electrode 52 may also be connected to the dummy conductive portion of the dummy trench portion 30 at an edge of the dummy trench portion 30 in the Y-axis direction.

The active-side gate wire 131 is connected to the gate trench portions 40 through the contact holes provided in the interlayer dielectric film. The active-side gate wire 131 may also be connected to a gate conductive portion of the gate trench portion 40 at an edge portion 41 of the gate trench portion 40 in the Y-axis direction. The active-side gate wire 131 is not connected to the dummy conductive portion in the dummy trench portion 30.

The emitter electrode 52 is formed of a material including metal. In FIG. 6, a range in which the emitter electrode 52 is provided is shown. For example, at least a part of a region of the emitter electrode 52 is formed of aluminum or an aluminum-silicon alloy. The emitter electrode 52 may have a barrier metal formed of titanium, titanium compound, or the like in a lower layer of the region formed of aluminum or the like. Also, the emitter electrode 52 may have a plug that is formed by embedding tungsten or the like so as to be in contact with the barrier metal and aluminum or the like, in the contact hole.

The well region 11 is provided overlapping the active-side gate wire 131. The well region 11 is also provided to extend in a predetermined width within a range that does not overlap the active-side gate wire 131. The well region 11 of the present example is provided apart from an end of the contact hole 54 in the Y-axis direction toward the active-side gate wire 131. The well region 11 is a second conductivity-type region having a higher doping concentration than the base region 14. In the present example, the base region 14 is P− type, and the well region 11 is P+ type.

Each of the transistor portion 70 and the diode portion 80 has a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 is provided along the arrangement direction. In the diode portion 80 of the present example, the gate trench portion 40 is not provided.

The gate trench portion 40 of the present example may have two linear portions 39 (portions of the trench that are linear along an extension direction) extending along an extension direction perpendicular to the alignment direction and an edge portion 41 connecting the two extension portions 39. The extension direction in FIG. 6 is the Y-axis direction.

At least a part of the edge portion 41 is preferably provided in a curved shape, as seen from above. The end portions of the two linear portions 39 in the Y-axis direction are connected each other by the edge portion 41, so that electric field concentration at the end portions of the linear portions 39 can be relaxed.

In the transistor portion 70, the dummy trench portion 30 is provided between the respective linear portions 39 of the gate trench portion 40. One dummy trench portion 30 may be provided or a plurality of the dummy trench portions 30 may be provided between the respective linear portions 39. The dummy trench portion 30 may have a linear shape extending in the extension direction, and may have linear portions 29 and an edge portion 31, like the gate trench portion 40. The semiconductor device 100 shown in FIG. 6 comprises both the linear dummy trench portion 30 with no edge portion 31 and the dummy trench portion 30 having the edge portion 31. Herein, each linear portion of each trench portion may be handled as one trench portion, in some cases.

A diffusion depth of the well region 11 may be greater than depths of the gate trench portion 40 and the dummy trench portion 30. The end portions of the gate trench portion 40 and the dummy trench portion 30 in the Y-axis direction are provided in the well region 11, as seen from above. That is, a bottom of each trench portion in the depth direction at the end portion of each trench portion in the Y-axis direction is covered with the well region 11. Thereby, the electric field concentration on the bottom of each trench portion can be relaxed.

A mesa portion is provided between the respective trench portions in the arrangement direction. The mesa portion indicates a region sandwiched between the trench portions inside the semiconductor substrate 10. As an example, an upper end of the mesa portion is the upper surface of the semiconductor substrate 10. A depth position of a lower end of the mesa portion is the same as a depth position of a lower end of the trench portion. The mesa portion of the present example provided extending the extension direction (Y-axis direction) along the trench in the upper surface of the semiconductor substrate 10. In the present example, the transistor portion 70 is provided with mesa portions 60, and the diode portion 80 is provided with mesa portions 61. Herein, when simply referring to the mesa portion, it indicates each of the mesa portion 60 and the mesa portion 61.

A mesa portion 60, which is in contact with the gate trench portion 40 and is provided with the emitter region 12, of the mesa portions 60 is referred to as a gate mesa portion. In the present example, the mesa portions 60 of the transistor portion 70 are all the gate mesa portions. In another example, the transistor portion 70 may have a dummy mesa portion that is not in contact with the gate trench portion 40 or is not provided with the emitter region 12.

Each of the mesa portions is provided with the base region 14. A region in each mesa portion, which is arranged the closest to the active-side gate wire 131, of the base region 14 exposed on the upper surface of the semiconductor substrate 10 is referred to as a base region 14-e. In FIG. 6, the base region 14-e arranged at one end portion of each mesa portion in the extension direction is shown. However, the base region 14-e is also arranged at the other end portion of each mesa portion. In each mesa portion, at least one of the emitter region 12 of a first conductivity-type and the contact region 15 of a second conductivity-type may be provided in a region sandwiched between the base regions 14-e, as seen from above. In the present example, the emitter region 12 is N+ type and the contact region 15 is P+ type. The emitter region 12 and the contact region 15 may also be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may also be provided with the contact region 15 exposed on the upper surface of the semiconductor substrate 10.

In the mesa portion 60, each of the contact region 15 and the emitter region 12 is provided from one trench portion to the other trench portion in the X-axis direction. As an example, the contact region 15 and the emitter region 12 of the mesa portion 60 are alternately arranged along the extension direction (Y-axis direction) of the trench portion.

In another example, the contact region 15 and the emitter region 12 of the mesa portion 60 may be provided in a stripe shape along the extension direction (Y-axis direction) of the trench portion. For example, the emitter region 12 is provided in a region in contact with the trench portion, and the contact region 15 is provided in a region sandwiched between the emitter regions 12.

The mesa portion 61 of the diode portion 80 is not provided with the emitter region 12. An upper surface of the mesa portion 61 may be provided with the base region 14 and the contact region 15. In a region sandwiched between the base region 14-e in an upper surface of the mesa portion 61, the contact region 15 may be provided in contact with each of the base regions 14-e. In a region sandwiched between the contact regions 15 in the upper surface of the mesa portion 61, the base region 14 may be provided. The base region 14 may also be arranged in the entire region sandwiched between the contact regions 15.

In the transistor portion 70, a buffer region may be provided in a region in contact with the diode portion 80. A mesa portion in the buffer region is a dummy mesa portion having the same structure as the mesa portion 61 of the diode portion 80. A lower surface of the dummy mesa portion in the buffer region is provided with a collector region 22. The buffer region is provided, so that it is possible to arrange a cathode region 82 and the gate mesa portion apart from each other and to suppress flow of carriers between the gate mesa portion and the cathode region 82.

The mesa portion in the buffer region may also have the contact region 15 in the upper surface of the semiconductor substrate 10, instead of at least a part of the base region 14 of the diode portion 80. In the mesa portion in the buffer region, an area of the contact region 15 in the upper surface thereof may be larger than an area of the contact region 15 in an upper surface of one mesa portion 60. Thereby, it is possible to easily extract carriers such as holes toward the emitter electrode 52 upon turn-off of the transistor portion 70.

The contact hole 54 is provided above each of the mesa portions. The contact hole 54 is arranged in a region sandwiched between the base regions 14-e. In the present example, the contact hole 54 is provided above each of the contact region 15, the base region 14 and the emitter region 12. The contact hole 54 is not provided in regions corresponding to the base region 14-e and the well region 11. The contact hole 54 may also be arranged at a center of the mesa portion 60 in the arrangement direction (X-axis direction).

In the diode portion 80, a region adjacent to the lower surface of the semiconductor substrate 10 is provided with the cathode region 82 of N+ type. In the lower surface of the semiconductor substrate 10, a region in which the cathode region 82 is not provided may be provided with the collector region 22 of P+ type. In FIG. 6, a boundary between the cathode region 82 and the collector region 22 is indicated by a dashed-dotted line.

Figure 7:
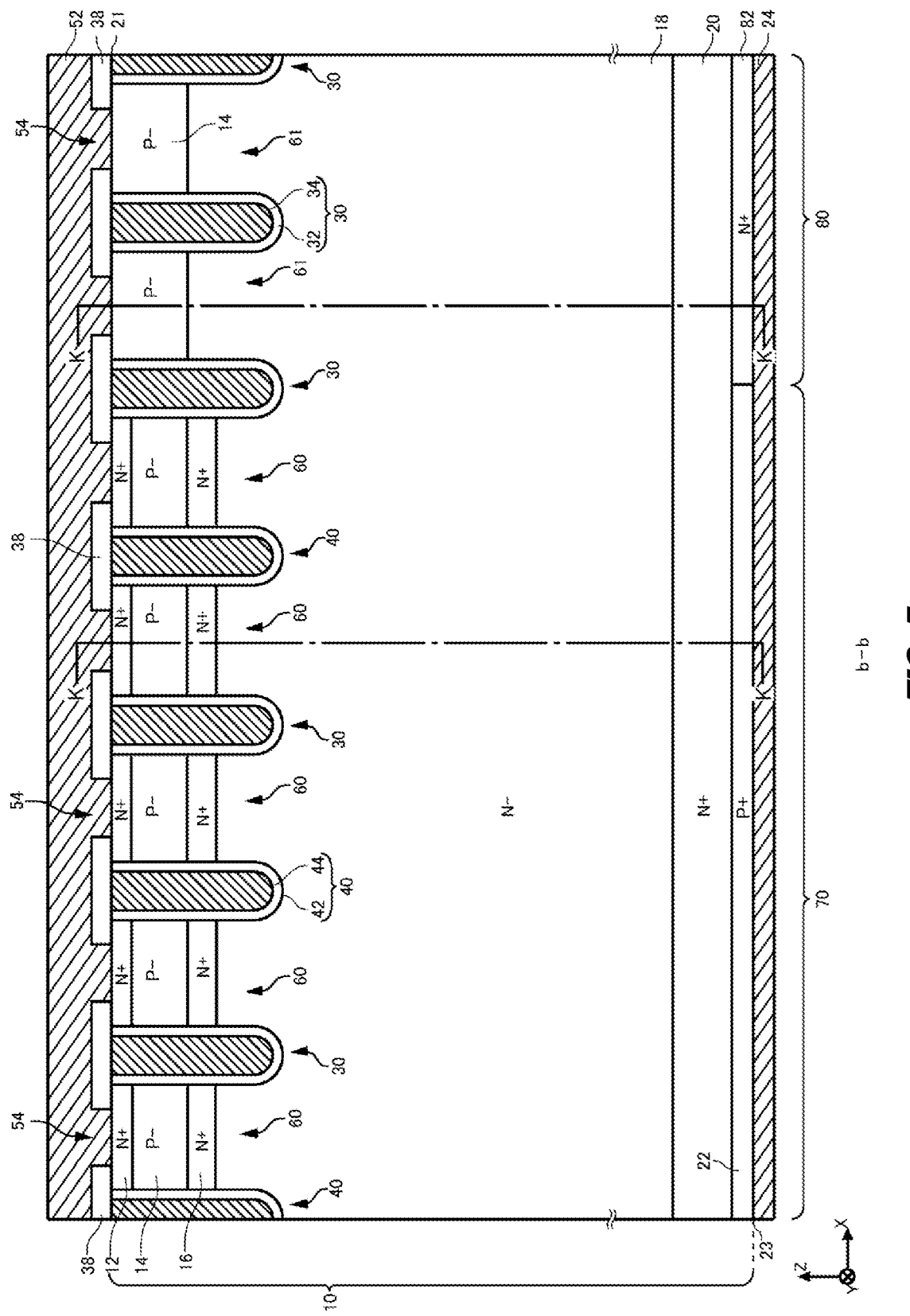
FIG. 7 shows an example of a cross-sectional view taken along a line b-b in FIG. 6.

FIG. 7 shows an example of a cross-sectional view taken along a line b-b in FIG. 6. The b-b cross-section is an XZ plane passing the emitter region 12 and the cathode region 82. In the cross-section, the semiconductor device 100 of the present example comprises a semiconductor substrate 10, an interlayer dielectric film 38, an emitter electrode 52 and a collector electrode 24. The interlayer dielectric film 38 is provided on an upper surface of the semiconductor substrate 10. The interlayer dielectric film 38 is a film including at least one layer of a dielectric film such as silicate glass added with impurities of boron, phosphorous or the like, a thermally oxidized film and other dielectric film. The interlayer dielectric film 38 is provided with the contact holes 54 described in FIG. 6.

The emitter electrode 52 is provided on the interlayer dielectric film 38. The emitter electrode 52 is in contact with the upper surface 21 of the semiconductor substrate 10 through the contact holes 54 in the interlayer dielectric film 38. The collector electrode 24 is provided on the lower surface 23 of the semiconductor substrate 10. The emitter electrode 52 and the collector electrode 24 are formed of a metal material such as aluminum. As used herein, a direction (Z-axis direction) in which the emitter electrode 52 and the collector electrode 24 are connected to each other is referred to as 'depth direction'.

The semiconductor substrate 10 has a drift region 18 of N− type. The drift region 18 is provided in each of the transistor portion 70 and the diode portion 80.

The mesa portion 60 of the transistor portion 70 is provided with the emitter region 12 of N+ type and the base region 14 of P− type sequentially from the upper surface 21-side of the semiconductor substrate 10. The drift region 18 is provided below the base region 14. The mesa portion 60 may also be provided with an accumulation region 16 of N+ type. The accumulation region 16 is arranged between the base region 14 and the drift region 18.

The emitter region 12 is arranged between the upper surface 21 of the semiconductor substrate 10 and the drift region 18. The emitter region 12 is exposed on the upper surface 21 of the semiconductor substrate 10, and is provided in contact with the gate trench portion 40. The emitter region 12 may also be in contact with the trench portions on both sides of the mesa portion 60. The emitter region 12 has a doping concentration higher than the drift region 18.

The base region 14 is provided between the emitter region 12 and the drift region 18. In the present example, the base region 14 is provided in contact with the emitter region 12. The base region 14 may also be in contact with the trench portions on both sides of the mesa portion 60.

The accumulation region 16 is provided below the base region 14. The accumulation region 16 has a doping concentration higher than the drift region 18. The accumulation region 16 having a high concentration is provided between the drift region 18 and the base region 14, so that it is possible to increase a carrier injection enhancement effect (IE effect), thereby reducing an on-voltage. The accumulation region 16 may also be provided to cover an entire lower surface of the base region 14 in each mesa portion 60.

In the mesa portion 61 of the diode portion 80, the base region 14 of P− type is provided in contact with the upper surface 21 of the semiconductor substrate 10. The base region 14 of the diode portion 80 functions as an anode region of the diode portion 80. The drift region 18 is provided below the base region 14. In the mesa portion 61, the accumulation region 16 may be provided below the base region 14.

In each of the transistor portion 70 and the diode portion 80, a buffer region 20 of N+ type may be provided below the drift region 18. A doping concentration in the buffer region 20 is higher than a doping concentration in the drift region 18. The buffer region 20 may serve as a field stop layer configured to prevent a depletion layer, which expands from a lower end of the base region 14, from reaching the collector region 22 of P+ type and the cathode region 82 of N+ type. The buffer region 20 may have a plurality of peaks or a single peak in a doping concentration distribution in the depth direction.

In the transistor portion 70, the collector region 22 of P+ type is provided below the buffer region 20. In the diode portion 80, the cathode region 82 of N+ type is provided below the buffer region 20. The collector region 22 and the cathode region 82 are exposed on the lower surface 23 of the semiconductor substrate 10 and are connected to the collector electrode 24.

On the upper surface 21-side of the semiconductor substrate 10, one or more gate trench portions 40 and one or more dummy trench portions 30 are provided. Each trench portion ranges from the upper surface 21 of the semiconductor substrate 10 to the drift region 18 through the base region 14. In a region in which at least any one of the emitter region 12, the contact region 15 and the accumulation region 16 is provided, each trench portion reaches the drift region 18 through the regions. The configuration "the trench portion penetrates a doped region" is not limited to a manufacturing sequence of forming the doped region and then forming the trench portion. A manufacturing of forming trench portions and then forming the doped region between the trench portions is also included in the configuration "the trench portion penetrates the doped region".

As described above, the transistor portion 70 is provided with the gate trench portion 40 and the dummy trench portion 30. The diode portion 80 is provided with the dummy trench portion 30, and is not provided with the gate trench portion 40.

In the present example, a boundary between the transistor portion 70 and the diode portion 80 in the X-axis direction is a boundary between the cathode region 82 and the collector region 22. In the example of FIG. 7, the dummy trench portion 30 is arranged at an end of the transistor portion 70 in the X-axis direction.

The gate trench portion 40 has a gate trench, a gate insulating film 42 and a gate conductive portion 44 provided in the upper surface 21 of the semiconductor substrate 10. The gate insulating film 42 is provided covering an inner wall of the gate trench. The gate insulating film 42 may be formed by oxidizing or nitriding a semiconductor of the inner wall of the gate trench. The gate conductive portion 44 is provided on a further inner side than the gate insulating film 42 inside the gate trench. That is, the gate insulating film 42 insulates the gate conductive portion 44 and the semiconductor substrate 10 each other. The gate conductive portion 44 is formed of a conductive material such as polysilicon.

The gate conductive portion 44 may be provided longer than the base region 14 in the depth direction. In the cross-section, the gate trench portion 40 is covered by the interlayer dielectric film 38 on the upper surface 21 of the semiconductor substrate 10. The gate conductive portion 44 is electrically connected to the gate wire. When a predetermined voltage is applied to the gate conductive portion 44, a channel by an inversion layer of electrons is formed on a surface layer of an interface of the base region 14 in contact with the gate trench portion 40.

The semiconductor device 100 of the present example has a trench type gate structure. However, in another example, the semiconductor device 100 may have a planar type gate structure. That is, the gate conductive portion 44 may also be provided above the upper surface 21 of the semiconductor substrate 10. The gate insulating film 42 may also be provided between the gate conductive portion 44 and the upper surface 21 of the semiconductor substrate 10.

In the cross-section, the dummy trench portion 30 may have the same structure as the gate trench portion 40. The dummy trench portion 30 has a dummy trench, a dummy insulating film 32 and a dummy conductive portion 34 provided in the upper surface 21 of the semiconductor substrate 10. The dummy conductive portion 34 is electrically connected to the emitter electrode 52. The dummy insulating film 32 is provided covering an inner wall of the dummy trench. The dummy conductive portion 34 is provided inside the dummy trench and provided on a further inner side than the dummy insulating film 32. The dummy insulating film 32 insulates the dummy conductive portion 34 and the semiconductor substrate 10 each other. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

In the present example, the gate trench portion 40 and the dummy trench portion 30 are covered by the interlayer dielectric film 38 on the upper surface 21 of the semiconductor substrate 10. Note that, bottoms of the dummy trench portion 30 and the gate trench portion 40 may each have a downwardly convex curved shape (a curve shape in a cross-section).

In the transistor portion 70, an oxygen concentration distribution in the depth direction (K-K) of the semiconductor substrate 10 is similar to the oxygen concentration distribution shown in FIG. 2 or FIG. 3. In the diode portion 80, an oxygen concentration distribution in the depth direction (K-K) of the semiconductor substrate 10 is also similar to the oxygen concentration distribution shown in FIG. 2 or FIG. 3. Thereby, it is possible to form the transistor portion 70 and the diode portion 80 by using the semiconductor substrate 10 whose oxygen concentration is accurately controlled. For this reason, it is possible to reduce variation in characteristics of the semiconductor device 100.

In the example of FIGS. 5 to 7, the semiconductor device 100 comprises both the transistor portion 70 and the diode portion 80 on one semiconductor substrate 10. In another example, the semiconductor device 100 may comprise the transistor portion 70, and may not comprise the diode portion 80. In this case, a structure of the transistor portion 70 is similar to the transistor portion 70 shown in FIGS. 6 and 7. The semiconductor device 100 may also comprise the diode portion 80, and may not comprise the transistor portion 70. In this case, a structure of the diode portion 80 is similar to the diode portion 80 shown in FIGS. 6 and 7.

Figure 8:
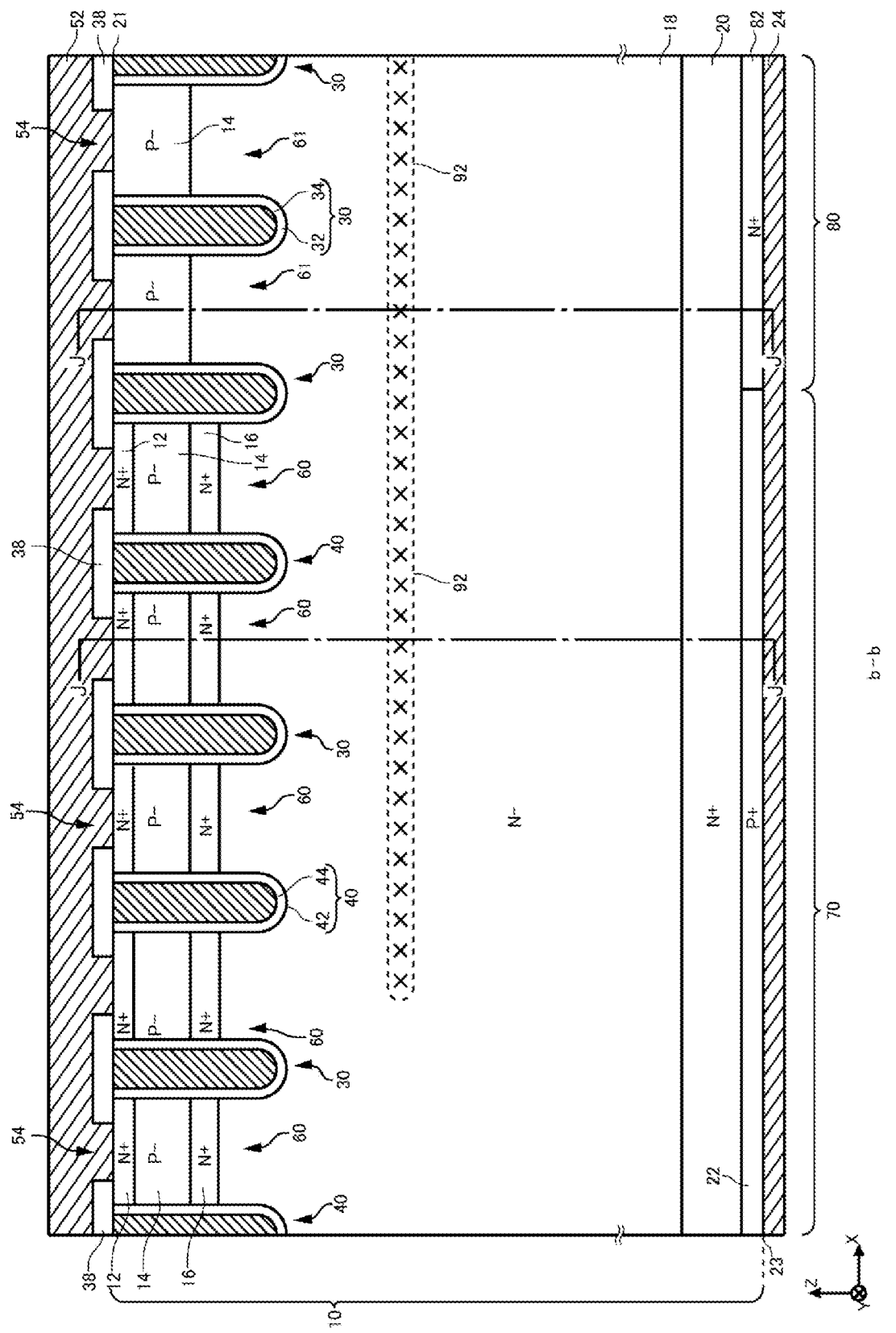
FIG. 8 shows another example of the cross-sectional view taken along the line b-b in FIG. 6.

FIG. 8 shows another example of the cross-sectional view taken along the line b-b in FIG. 6. The semiconductor device 100 of the present example comprises an upper surface-side lifetime control region 92, in addition to the configuration of the semiconductor device 100 described in FIG. 7. The upper surface-side lifetime control region 92 is a region that is provided on the upper surface 21-side of the semiconductor substrate 10 and reduces a lifetime of carriers. The upper surface-side lifetime control region 92 includes crystal defects such as VO defects. The carriers of the semiconductor substrate 10 recombine with the crystal defects, so that the lifetime of carriers is reduced. In FIG. 8, density peak positions of the crystal defects in the depth direction are denoted by x-marks. The upper surface-side lifetime control region 92 is a region including the density peak positions of the crystal defects. The crystal defects may be formed by irradiating impurities such as helium ions, hydrogen ions or the like from the upper surface 21-side or the lower surface 23-side of the semiconductor substrate 10. The density peak positions of the crystal defects correspond to concentration peak positions of the impurities irradiated so as to form the crystal defects.

The upper surface-side lifetime control region 92 is provided in the diode portion 80. The upper surface-side lifetime control region 92 may be provided in the entire diode portion 80 in the X-axis direction. The diode portion 80 is provided with the upper surface-side lifetime control region 92, so that it is possible to reduce a reverse recovery time in the diode portion 80, thereby reducing a reverse recovery loss.

The upper surface-side lifetime control region 92 may also be provided in the transistor portion 70. The upper surface-side lifetime control region 92 may also be provided continuously in the X-axis direction in the diode portion 80 and in a part of the transistor portion 70 in contact with the diode portion 80. The upper surface-side lifetime control region 92 is also provided in the part of the transistor portion 70 in contact with the diode portion 80, so that it is possible to suppress carriers from flowing from the upper surface-side of the transistor portion 70 toward the cathode region 82.

Figure 9:
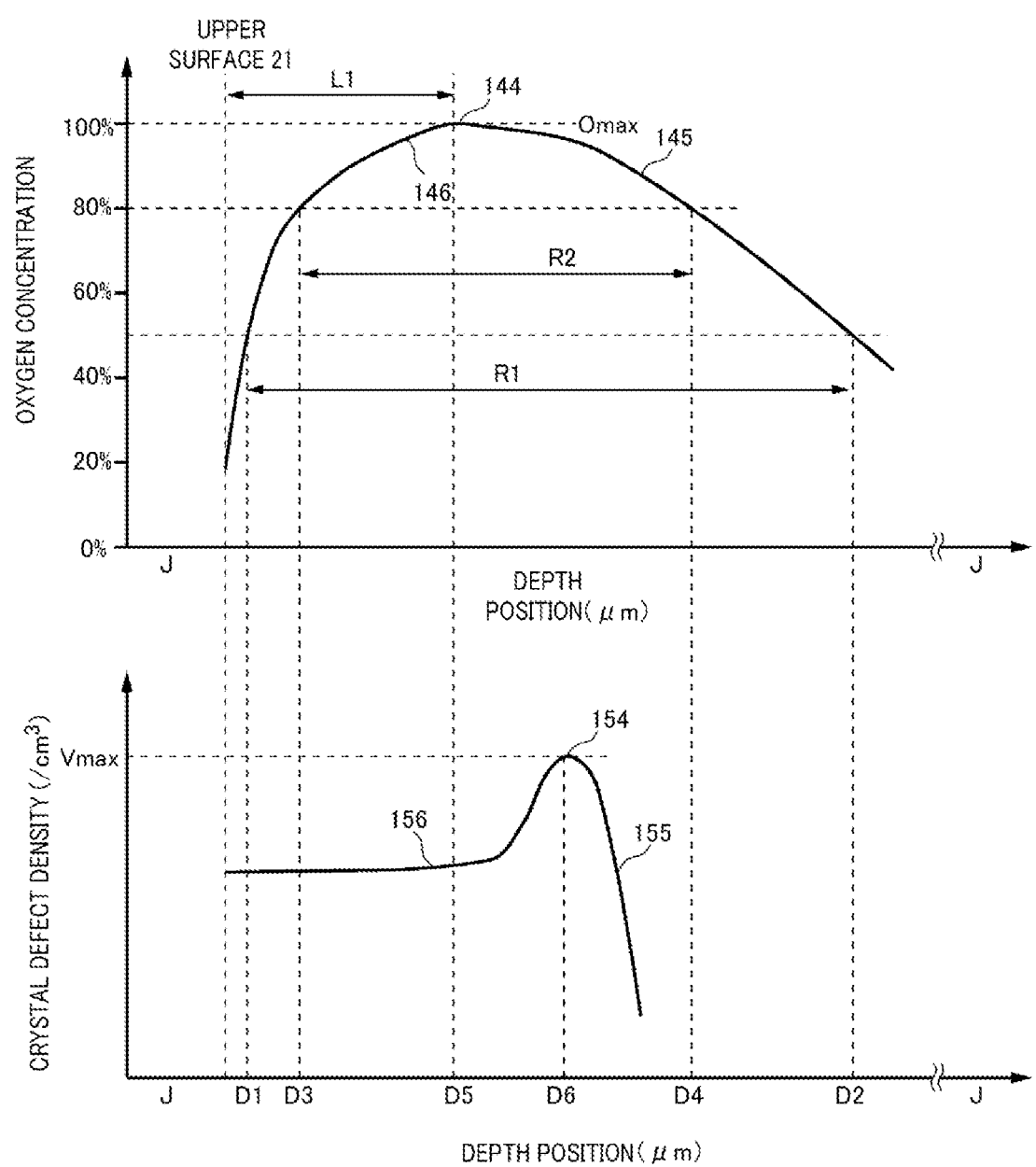
FIG. 9 shows an example of an oxygen concentration distribution and a crystal defect density distribution in a J-J cross-section in FIG. 8.

FIG. 9 shows an example of the oxygen concentration distribution and a crystal defect density distribution in a J-J cross-section in FIG. 8. The J-J cross-section is an YZ cross-section passing the upper surface-side lifetime control region 92. Both a region in the diode portion 80 where the upper surface-side lifetime control region 92 is provided and a region in the transistor portion 70 where the upper surface-side lifetime control region 92 is provided may have the distributions shown in FIG. 9.

The oxygen concentration distribution shown in FIG. 9 is similar to the oxygen concentration distribution shown in FIG. 2 or FIG. 3. In FIG. 9, a vertical axis of the oxygen concentration distribution is an axis indicating each oxygen concentration by a percentage when the oxygen concentration Omax at the concentration peak 144 is 100%. The oxygen concentration distribution in FIG. 9 is an enlarged view of the vicinity of the concentration peak 144. In FIG. 9, a vertical axis of the crystal defect density distribution is a logarithmic axis, and a horizontal axis is a linear axis indicating positions in the depth direction.

The crystal defect density distribution in the depth direction of the semiconductor substrate 10 has an upper surface-side density peak 154 in a region of the upper surface 21-side of the semiconductor substrate 10 (i.e., a region raging from the center position Dc to the upper surface 21 of the semiconductor substrate 10). The crystal defect density distribution has an upper surface-side slope 156 from the upper surface-side density peak 154 toward the upper surface 21, and a lower surface-side slope 155 from the upper surface-side density peak 154 toward the lower surface 23. In the present example, the crystal defects are formed by implanting ions such as helium from the upper surface 21-side of the semiconductor substrate 10. In this case, since the crystal defects are also formed in a region through which ions such as helium have passed, a gradient of the upper surface-side slope 156 is gentler than a gradient of the lower surface-side slope 155. A depth position of the upper surface-side density peak 154 substantially coincides with a peak position of a concentration distribution of ions such as helium irradiated so as to form the crystal defects. In another example, the crystal defects may also be formed by implanting ions such as helium from the lower surface 23-side of the semiconductor substrate 10. In this case, the gradient of the lower surface-side slope 155 is gentler than the gradient of the upper surface-side slope 156.

In the oxygen concentration distribution, a depth range within which the oxygen concentration is equal to or greater than 50% of the oxygen concentration Omax at the concentration peak 144 is denoted as R1, and a depth range within which the oxygen concentration is equal to or greater than 80% of the oxygen concentration Omax is denoted as R2. The upper surface-side density peak 154 is preferably arranged within the depth range R1.

The oxygen concentration within the depth range R1 has a small difference from the oxygen concentration Omax, and is accurately controlled by the annealing temperature. For this reason, by setting a range of ions such as helium for forming the crystal defects in the depth range R1, ions such as helium can be implanted into a region where variation in oxygen concentration is small. Since a density of crystal defects to be formed varies depending on the oxygen concentration, it is possible to reduce variation in density peak value Vmax at the upper surface-side density peak 154.

The upper surface-side density peak 154 may also be arranged within the depth range R2. Thereby, the variation in density peak value Vmax can be further reduced.

Note that, the concentration peak 144 in the oxygen concentration distribution may also be arranged between the upper surface-side density peak 154 and the upper surface 21 of the semiconductor substrate 10. That is, the upper surface-side density peak 154 may be arranged at a position overlapping the lower surface-side slope 145 in the oxygen concentration distribution. Thereby, the upper surface-side density peak 154 can be arranged in a region of the oxygen concentration distribution where the gradient is small. Therefore, even when the position of the upper surface-side density peak 154 in the depth direction varies, it is possible to reduce the variation in oxygen concentration caused due to the position variation and the variation in the density peak value Vmax. Also in this case, the upper surface-side density peak 154 is preferably arranged within the range R1 or the range R2.

A length of the depth range R1 in the depth direction may also be equal to or greater than 10 μm. By setting the depth range R1 long, the upper surface-side density peak 154 can be easily provided within the depth range R1, and the variation in density peak value Vmax can be reduced. A length of the depth range R2 in the depth direction may also be equal to or greater than 10 μm. Thereby, the variation in density peak value Vmax can be further reduced. The length of the depth range R1 or R2 may also be equal to or greater than 15 μm or equal to or greater than 20 μm.

The length of the depth range R1 or R2 can be controlled by the annealing conditions and the like. For example, when the annealing time is set longer, oxygen can be distributed up to a deeper position in the semiconductor substrate 10 at a concentration close to the solid solubility limit. For this reason, the depth range R1 or R2 can be lengthened. The annealing time may be 1 hour or longer, 5 hours or longer or 10 hours or longer.

In addition, a distance L1 between the concentration peak 144 of the oxygen concentration distribution and the upper surface 21 of the semiconductor substrate 10 may be equal to or greater than 5 μm and equal to or smaller than 20 μm. By setting the distance L1 small to some extent, it is possible to shorten a length of a region in which the oxygen concentration distribution changes relatively sharply. The distance L1 may also be equal to or shorter than 10 μm. The distance L1 may also be smaller than a length of the dummy trench portion 30 in the depth direction, which is shown in FIG. 5 and the like. On the other hand, a distance between the upper surface-side density peak 154 and the upper surface 21 may be longer than the length of the dummy trench portion 30 in the depth direction. Thereby, the upper surface-side density peak 154 is arranged at a position overlapping the lower surface-side slope 145 of the oxygen concentration distribution.

Note that, the semiconductor device 100 shown in FIG. 8 has the upper surface-side lifetime control region 92 on the upper surface 21-side of the semiconductor substrate 10, and does not have a lifetime control region on the lower surface 23-side. That is, on the lower surface 23-side of the semiconductor substrate 10, the crystal defect density distribution, the lifetime distribution and the like in the depth direction do not have extreme values such as peaks, valleys and the like.

On the lower surface 23-side of the semiconductor substrate 10, the influence of the initial oxygen concentration is stronger, as compared to the upper surface 21-side, so that the variation in oxygen concentration is likely to increase. The lifetime control region is not provided on the lower surface 23-side, so that it is possible to reduce the variation in characteristics of the semiconductor device 100.

Figure 10:
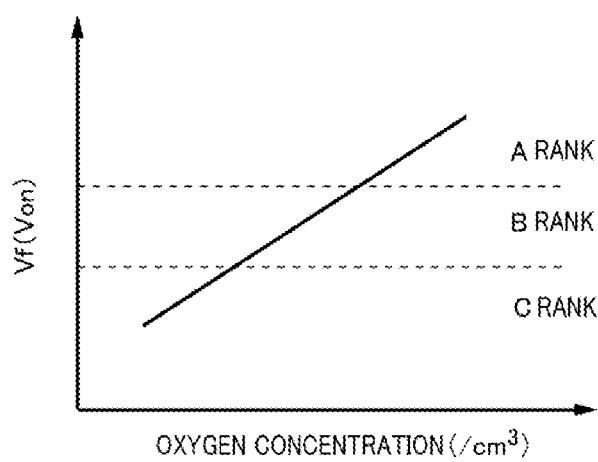
FIG. 10 shows a relation between the oxygen concentration and a forward voltage Vf when a semiconductor substrate having an oxygen concentration distribution that is substantially uniform in a depth direction is formed with an upper surface-side lifetime control region 92 as shown in FIG. 8.

FIG. 10 shows a relation between the oxygen concentration and a forward voltage Vf when a semiconductor substrate having an oxygen concentration distribution that is substantially uniform in a depth direction is formed with the upper surface-side lifetime control region 92 as shown in FIG. 8. As shown in FIG. 10, the crystal defect density varies depending on the oxygen concentration in the semiconductor substrate and the forward voltage Vf also varies.

For this reason, when manufacturing a semiconductor device by using a semiconductor substrate having no oxygen concentration distribution as shown in FIGS. 1 to 9, oxygen concentrations in prepared semiconductor substrates are measured in advance and the substrates are ranked according to the oxygen concentrations. Then, a semiconductor substrate of a rank corresponding to a use of the semiconductor device is used. Since the oxygen concentration in the semiconductor substrate manufactured by the MCZ method, the FZ method and the like is likely to vary, it is difficult to stably prepare a semiconductor substrate having a predetermined oxygen concentration.

In contrast, like the examples shown in FIGS. 1 to 9, when the semiconductor substrate 10 is annealed, on condition that the solid solubility limit is higher than the initial concentration of the semiconductor substrate 10, it is possible to set the oxygen concentration in the semiconductor substrate 10 to a predetermined concentration and to reduce the variation in oxygen concentration among the substrates. For this reason, it is possible to suppress variation in performance of the semiconductor device 100 and to reduce the preparation cost of the semiconductor substrate.

Figure 11:
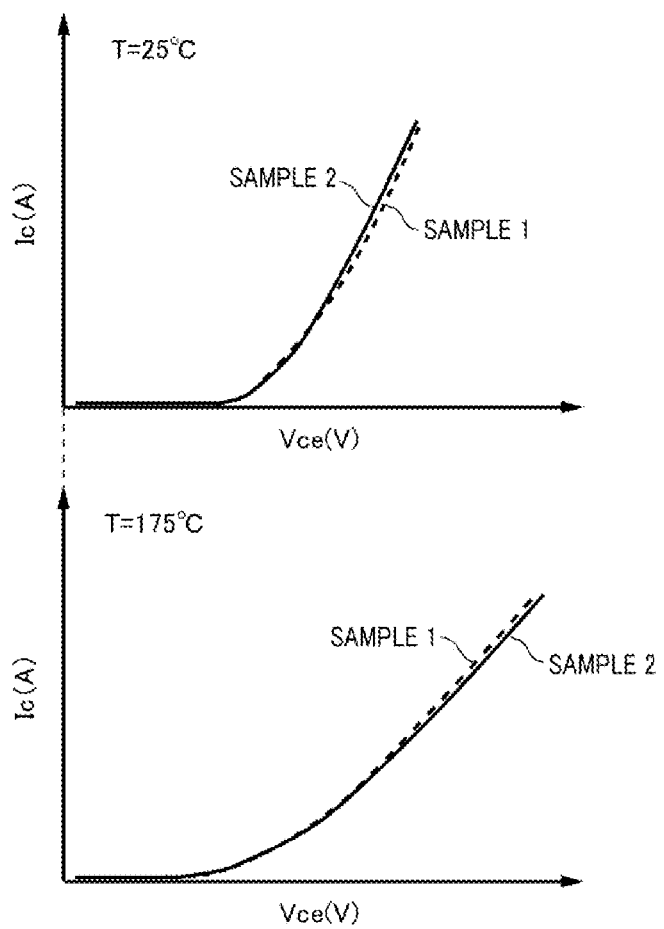
FIG. 11 compares characteristics of the semiconductor devices 100 manufactured using two semiconductor substrates 10 having different initial concentrations of oxygen.

FIG. 11 compares characteristics of the semiconductor devices 100 manufactured using two semiconductor substrates 10 having different initial concentrations of oxygen. The initial oxygen concentration of the semiconductor substrate 10 of Sample 1 is $4\times10^{16}/cm^3$, and the initial oxygen concentration of the semiconductor substrate 10 of Sample 2 is $4\times10^{17}/cm^3$. The structure of the semiconductor device 100 is similar to the example of FIG. 8. The semiconductor substrate 10 of Sample 1 is a substrate manufactured by the FZ method, and the semiconductor substrate 10 of Sample 2 is a substrate manufactured by the MCZ method.

The semiconductor substrates 10 were subjected to the annealing process at conditions that the solid solubility limit is 1.5 times as large as $4\times10^{17}/cm^3$. The annealing conditions for Sample 1 and 2 are the same. For the manufactured semiconductor devices 100 of Sample 1 and 2, a relation between a collector-emitter voltage (Vce) and a collector current (Ic) was measured under atmospheres of 25° C. and 175° C. At any temperature, the characteristics of Sample 1 and 2 were substantially the same.

As such, according to the semiconductor device 100 described in FIGS. 1 to 9, it is possible to reduce the variation in characteristics due to the variation in initial oxygen concentration. Also, even when the semiconductor substrates 10 manufactured by the different manufacturing methods such as the MCZ method and the FZ method are used, it is possible to manufacture the semiconductor devices 100 whose characteristics are substantially the same.

Figure 12:
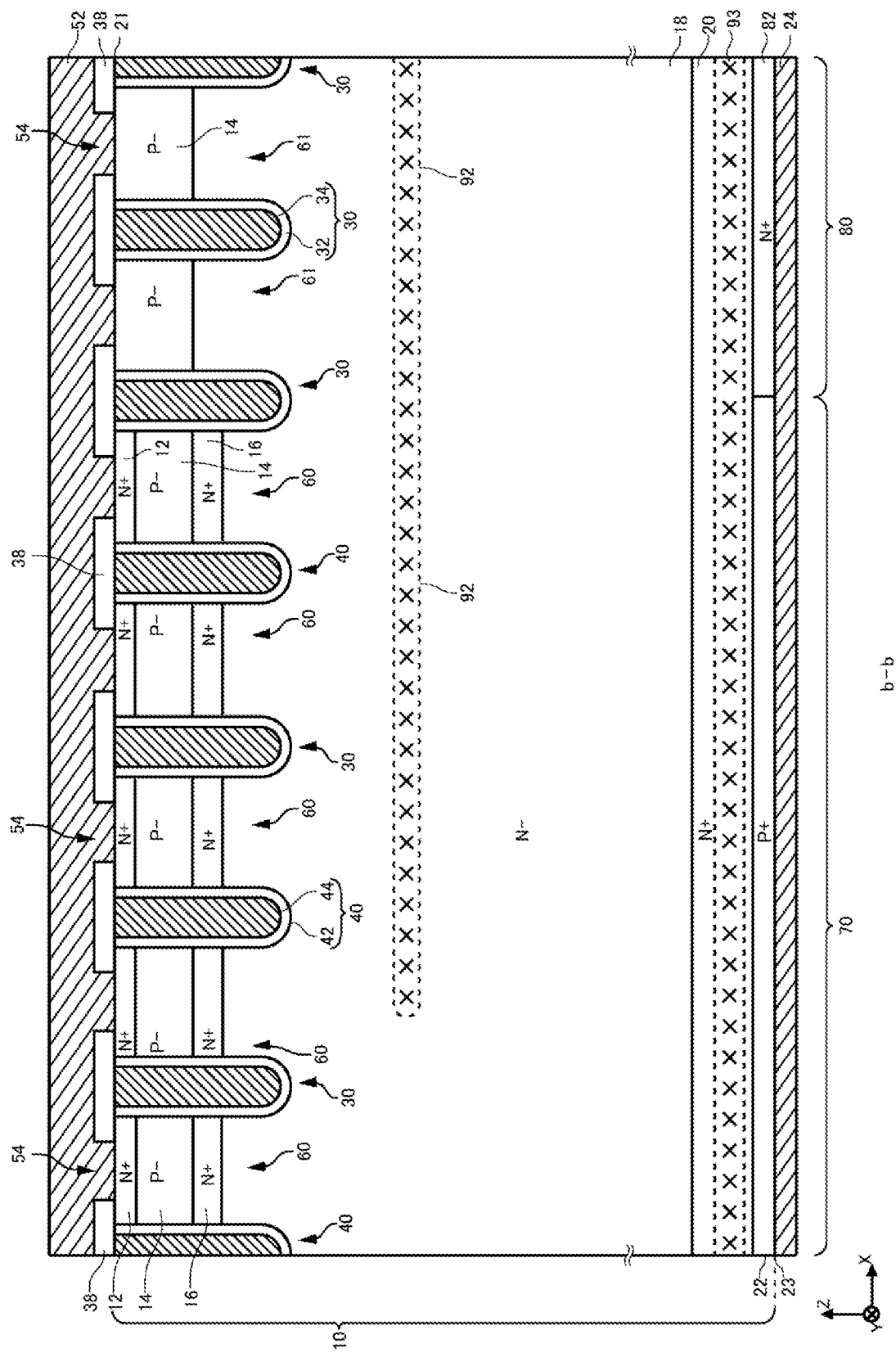
FIG. 12 shows another example of the semiconductor device 100.

FIG. 12 shows another example of the semiconductor device 100. The semiconductor device 100 of the present example is different from the structure of the semiconductor device 100 shown in FIG. 8, in that a lower surface-side lifetime control region 93 is provided. The configurations except the lower surface-side lifetime control region 93 are the same as the example shown in FIG. 8.

The lower surface-side lifetime control region 93 is arranged on the lower surface 23-side of the semiconductor substrate 10 (i.e., in a region from the center position Dc to the lower surface 23 of the semiconductor substrate 10 in the depth direction). In the present example, the lower surface-side lifetime control region 93 may also be provided at a position overlapping the buffer region 20. The lower surface-side lifetime control region 93 may also be provided over a range wider than the upper surface-side lifetime control region 92 in the X-axis direction. In the present example, the lower surface-side lifetime control region 93 is provided in the diode portion 80 and the transistor portion 70 in their entirety in the X-axis direction.

The structure and formation method of the lower surface-side lifetime control region 93 are similar to the upper surface-side lifetime control region 92. However, the lower surface-side lifetime control region 93 may also be formed by irradiating ions such as helium from the lower surface 23-side of the semiconductor substrate 10.

The lower surface-side lifetime control region 93 is provided, so that it is possible to control the carrier lifetime in the semiconductor substrate 10 with higher accuracy. Note that, the lower surface-side lifetime control region 93 is preferably provided at a position overlapping the lower surface-side slope 145 of the oxygen concentration distribution. That is, the lower surface-side lifetime control region 93 is not preferably provided in the flat region 147 shown in FIG. 3. Thereby, it is possible to reduce the influence of the variation in initial oxygen concentration. However, the lower surface-side lifetime control region 93 may also be provided in the flat region 147.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10 . . . semiconductor substrate, 11 . . . well region, 12 . . . emitter region, 14 . . . base region, 15 . . . contact region, 16 . . . accumulation region, 18 . . . drift region, 20 . . . buffer region, 21 . . . upper surface, 22 . . . collector region, 23 . . . lower surface, 24 . . . collector electrode, 29 . . . linear portion, 30 . . . dummy trench portion, 31 . . . edge portion, 32 . . . dummy insulating film, 34 . . . dummy conductive portion, 38 . . . interlayer dielectric film, 39 . . . linear portion, 40 . . . gate trench portion, 41 . . . edge portion, 42 . . . gate insulating film, 44 . . . gate conductive portion, 52 . . . emitter electrode, 54 . . . contact hole, 60, 61 . . . mesa portion, 70 . . . transistor portion, 80 . . . diode portion, 81 . . . extension region, 82 . . . cathode region, 90 . . . edge termination structure portion, 92 . . . upper surface-side lifetime control region, 93 . . . lower surface-side lifetime control region, 100 . . . semiconductor device, 102 . . . end side, 112 . . . gate pad, 120 . . . active portion, 130 . . . outer periphery gate wire, 131 . . . active-side gate wire, 141 . . . upper surface-side electrode, 142 . . . lower surface-side electrode, 143 . . . high oxygen concentration part, 144 . . . concentration peak, 145 . . . lower surface-side slope, 146 . . . upper surface-side slope, 147 . . . flat region, 154 . . . upper surface-side density peak, 155 . . . lower surface-side slope, 156 . . . upper surface-side slope

What is claimed is:

1. A semiconductor device comprising:
a semiconductor substrate containing oxygen, the semiconductor substrate having an upper surface and a lower surface, wherein
an oxygen concentration distribution in a depth direction of the semiconductor substrate has a high oxygen concentration part where an oxygen concentration is higher on a further upper surface-side than a center in the depth direction of the semiconductor substrate than in the lower surface of the semiconductor substrate,
the high oxygen concentration part has a concentration peak in the oxygen concentration distribution,
a crystal defect density distribution in the depth direction of the semiconductor substrate has an upper surface-side density peak on the upper surface-side of the semiconductor substrate,
the upper surface-side density peak is arranged within a depth range in which the oxygen concentration is equal to or greater than 50% of a peak value of the concentration peak, and
the concentration peak in the oxygen concentration distribution is arranged between the upper surface-side density peak and the upper surface of the semiconductor substrate, such that the upper surface-side density peak is at a position which overlaps a lower surface-side slope in the oxygen concentration distribution.

2. The semiconductor device according to claim 1, wherein
the oxygen concentration decreases from the concentration peak toward the lower surface of the semiconductor substrate until it becomes the same as the oxygen concentration in the lower surface of the semiconductor substrate.

3. The semiconductor device according to claim 1, wherein
the upper surface-side density peak is arranged within a depth range in which the oxygen concentration is equal to or greater than 80% of the peak value of the concentration peak.

4. The semiconductor device according to claim 1, wherein
in the oxygen concentration distribution, the depth range within which the oxygen concentration is equal to or greater than 50% of the peak value of the concentration peak is equal to or greater than 10 μm.

5. The semiconductor device according to claim 1, wherein
a peak value of the concentration peak is 1.5 times or greater as large as a minimum value of the oxygen concentration in the oxygen concentration distribution.

6. The semiconductor device according to claim 5, wherein
the peak value of the concentration peak is 5 times or greater as large as the minimum value of the oxygen concentration in the oxygen concentration distribution.

7. The semiconductor device according to claim 1, wherein a distance between the concentration peak of the oxygen concentration distribution and the upper surface of the semiconductor substrate is equal to or greater than 5 μm and equal to or smaller than 20 μm.

8. The semiconductor device according to claim 1, further comprising:
a gate conductive portion provided in the upper surface of the semiconductor substrate; and
a gate insulating film for insulating the gate conductive portion and the semiconductor substrate from each other.

9. The semiconductor device according to claim 1, further comprising:

a cathode region of a first conductivity-type provided in contact with the lower surface of the semiconductor substrate, and an anode region of a second conductivity-type provided in contact with the upper surface of the semiconductor substrate.

10. The semiconductor device according to claim 1, wherein the semiconductor substrate is provided with an active portion and an edge termination structure portion surrounding the active portion, and the active portion is provided with a transistor portion and a diode portion.

11. The semiconductor device according to claim 10, wherein the transistor portion and the diode portion are alternately arranged in an arrangement direction.

12. The semiconductor device according to claim 10, wherein the transistor portion and the diode portion each have a base region of a second conductivity-type provided in contact with the upper surface of the semiconductor substrate, the transistor portion has a collector region of a second conductivity-type provided in contact with the lower surface of the semiconductor substrate, the diode portion has a cathode region of a first conductivity-type provided in contact with the lower surface of the semiconductor substrate, and the base region provided in the diode portion functions as an anode region.

13. The semiconductor device according to claim 10, wherein the transistor portion is provided with a gate trench portion, the transistor portion and the diode portion each have a dummy trench portion, the gate trench portion has:

a gate trench provided in the upper surface of the semiconductor substrate, a gate insulating film covering an inner wall of the gate trench, and a gate conductive portion provided on a further inner side than the gate insulating film in the gate trench, and the dummy trench portion has:

a dummy trench provided in the upper surface of the semiconductor substrate, a dummy insulating film covering an inner wall of the dummy trench, and a dummy conductive portion provided on a further inner side than the dummy insulating film in the dummy trench.

14. The semiconductor device according to claim 10, wherein the diode portion is provided with an upper surface-side lifetime control region.

* * * * *